(12) United States Patent
Hollingsworth et al.

(10) Patent No.: US 6,831,511 B2
(45) Date of Patent: Dec. 14, 2004

(54) DISTORTION CANCELLATION FOR RF AMPLIFIERS USING COMPLEMENTARY BIASING CIRCUITRY

(75) Inventors: Gregg Alan Hollingsworth, Tempe, AZ (US); Khalid Paul Shallal, Chandler, AZ (US); Dean T. Muellenberg, Tempe, AZ (US)

(73) Assignee: Sirenza Microdevices, Inc., Broomfield, CO (US)

( * ) Notice: Subject to any disclaimer, the term of this patent is extended or adjusted under 35 U.S.C. 154(b) by 129 days.

(21) Appl. No.: 10/360,028

(22) Filed: Feb. 5, 2003

(65) Prior Publication Data

US 2004/0150473 A1 Aug. 5, 2004

(51) Int. Cl.[7] .............................................. H03F 3/68
(52) U.S. Cl. .................... 330/124 R; 330/289; 330/295
(58) Field of Search ........................... 330/53, 124 R, 330/286, 289, 295

(56) References Cited

U.S. PATENT DOCUMENTS

| | | | |
|---|---|---|---|
| 5,541,554 A | * | 7/1996 | Stengel et al. ............... 330/295 |
| 6,307,436 B1 | | 10/2001 | Hau |
| 6,346,853 B1 | | 2/2002 | Kangaslahti et al. |
| 6,515,545 B1 | * | 2/2003 | Hu et al. ................. 330/124 R |
| 6,653,898 B2 | * | 11/2003 | Monroe .................... 330/124 R |
| 6,731,173 B1 | * | 5/2004 | Thompson ................... 330/295 |

* cited by examiner

Primary Examiner—Khanh Van Nguyen
(74) Attorney, Agent, or Firm—Boris G. Tankhilevich (57) ABSTRACT

An apparatus for improving linearity of an RF signal comprising: (a) a splitter configured to receive an input RF signal, and configured to split the input RF signal into two RF signals comprising a first input RF signal, and a second input RF signal; (b) an over-biased non-linear RF power amplifier configured to receive the first input RF signal and configured to generate an over-biased non-linear output signal having an over-biased non-linear distortion component; (c) an under-biased non-linear RF power amplifier configured to receive the second input RF signal and configured to generate an under-biased non-linear output signal having an under-biased non-linear distortion component; and (d) a combiner configured to combine the over-biased non-linear output signal and the under-biased non-linear output signal, and configured to output the RF signal having substantially cancelled over-biased and under-biased distortion components. The over-biased non-linear RF power amplifier is configured to receive an over-biased DC signal being greater than an optimum bias DC voltage. The under-biased non-linear RF power amplifier is configured to receive an under-biased DC signal being lower than the optimum bias DC voltage.

38 Claims, 9 Drawing Sheets

Using Analog Potentiometer And Diode For Temp Sensor

FIG._9A

Using Analog Potentiometer And Transistor For Temp Sensor

Where $U_N$ is a Transistor that is Under-Biased
$O_N$ is a Transistor that is Over-Biased

FIG._14

DISTORTION CANCELLATION FOR RF AMPLIFIERS USING COMPLEMENTARY BIASING CIRCUITRY

BACKGROUND OF THE INVENTION

1. Field of the Invention

The present invention is in the field of nonlinear devices, and more specifically, is in the field of reducing distortion produced by nonlinear devices.

2. Discussion of the Prior Art

In the prior art, digital modulation schemes are widely employed in various multi-carrier communication systems (for instance, in wireless communication systems, in satellite communication systems, etc.) to achieve multiple objectives, like capacity improvement, better transmitted quality of data, and higher data rate transmission. In non-constant envelope digital modulation schemes, the information is included in both amplitude and phase of the modulated signals.

In the prior art, a linear amplifier is a preferable device to amplify such signals, because, in theory, an ideal linear amplifier does not cause signal distortions. On the other hand, a non-linear amplifier causes degradation of signal quality due to amplitude and phase distortions caused by nonlinear devices. In addition, linear amplifiers are also beneficial in amplifying multi-carrier signals simultaneously, in applications such as cellular base stations, without creating significant distortions.

One more advantage of employing linear amplifiers is that it reduces the number of amplifiers used, as well as eliminates high power combiner chains. Thus, usage of linear amplifiers directly results in reducing size, complexity and cost of the overall amplification systems which is highly important in applications such as satellite systems and cellular base stations.

The DC power consumption for linear amplifiers should also be minimized in order to attain high efficiency, higher performance reliability and reduction of operating costs. Such features of linear amplifiers are highly desirable in all communication systems.

In order to meet the linearity amplification requirement for non-constant envelope modulated signals in wireless communication systems, conventional linear amplifiers usually operate at a certain output power level (back off power level) that is different from a saturated power level. However, operating a linear amplifier at a back off power level has its own drawbacks. Indeed, the tradeoff of operating a linear amplifier at a back off power level is a low DC-to-RF efficiency on the amplifiers since peak DC-to-RF efficiency is usually achieved near a saturated output power level.

The prior art amplifier linearization techniques are widely used to improve the efficiency of non-linear amplifiers. However, conventional linearization techniques require the use of external circuitry to reduce distortion levels at the output of non-linear amplifiers.

The prior art common linearization techniques, such as feedforward, predistortion, and feedback techniques, have been disclosed in "Feedfoward—An alternative approach to amplifier linearization," by T. J. Bennett et al., The Radio and Electronic Engineer, vol. 44, no. 5, pp. 257–262, May 1974; "Feedforward linearization of 950 MHz amplifiers," by R. D. Stewart et al., IEEE Proceedings-H, vol. 135, no. 5, pp. 347–350, October 1988; "An automatically controlled predistorter for multilevel quadrature amplitude modulation, by J. Namiki, IEEE Trans. Commun., vol. COM-31, no. 5, pp. 707–712, May 1983; U.S. Pat. No. 4,465,980 by Huang et al.; U.S. Pat. No. 5,523,716 by Grebliunas et al.; U.S. Pat. No. 5,886,572 by Myers et al.; U.S. Pat. No. 5,821,814 by Katayama et al; U.S. Pat. No. 5,781,069 by Baskin. These techniques, however, usually involve very complex circuit configurations and require extensive alignment in production.

Recently, predistorters with simpler configuration have been disclosed in "A normal amplitude and phase linearizing technique for microwave power amplifiers," M. Nakayama et al., 1995 IEER MTT-S Dig., pp. 1451–1454; "A novel series diode linearizer for mobile radio power amplifiers," by K. Yamauchi et al., 1996 IEEE MTT-S Dig., pp. 831–834; "Passive FETMMIC linearizers for C, X and Ku-band satellite applications," A. Katz et al., 1993 IEEE MTT-S Dig., pp. 353–356; U.S. Pat. No. 5,191,338 by Katz et al; U.S. Pat No. 6,396,327 by Lam; U.S. Pat. No. 6,307,436 by Hau; U.S. Pat. No. 6.346,853 by Kangaslahti et al.

Figure 1A:
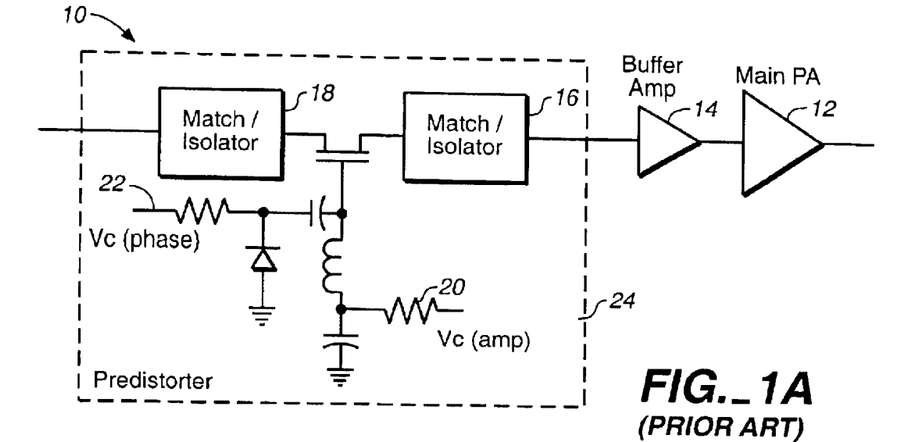
FIG. 1A depicts the first prior art embodiment of the miniaturized conventional predistorter circuitry utilized to linearize a power amplifier.
Figure 1B:
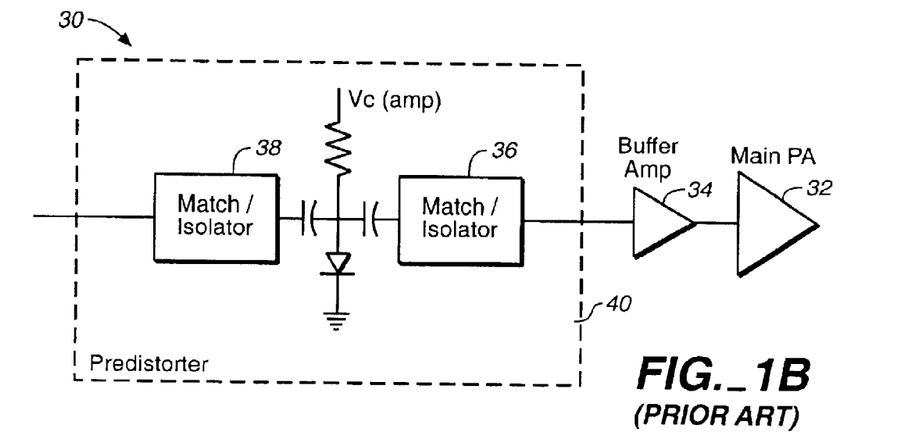
FIG. 1B shows the second prior art embodiment of the miniaturized conventional predistorter circuitry utilized to linearize a power amplifier.

As shown in FIG. 1A, the prior art recently developed circuitry 10 for linearized power amplifier (PA) 12 utilizes the conventional miniaturized predistorter design 24. Similarly, as shown in FIG. 1B, the recently developed prior art circuitry 30 for linearized power amplifier (PA) 32 utilizes the conventional miniaturized predistorter design 40. Though these recently developed prior art predistortion schemes achieve the circuitry size reduction over conventional size of circuitry design, they still require extra matching circuits, as shown in predistortion circuitry 24 of FIG. 1A, as well as shown in predistortion circuitry 40 of FIG. 1B.

In addition, these prior art predistortion schemes (10 of FIG. 1A and 30 of FIG. 1B) are difficult to use because they have poor isolation. Indeed, since conventional predistorters usually experience poor reverse isolation, power amplifiers incorporating the predistorters require additional isolators to improve circuit isolation to avoid interaction between the predistorters and amplifier stages which would degrade overall circuit performance.

The predistortion schemes (10 of FIG. 1A and 30 of FIG. 1B) also experience high loss. Indeed, predistorters 24 (of FIG. 1A) and 40 (of FIG. 1B) are all passive in nature with insertion loss level ranges from 4 dB to 20 dB depending on the design. Extra buffer amplifiers (14 of FIG. 1A; 34 of FIG. 1B) are usually added to compensate the high insertion loss. The use of buffer amplifiers is of particular concern as that would increase overall DC power consumption. Even though the overall efficiency of the linearized amplifier is improved, the increased DC power requirements increase the size and cost of the power supply or battery needed.

What is needed is to develop a novel linearized circuitry for a power amplifier that is free from the above-identified problems.

SUMMARY OF THE INVENTION

To address the shortcomings of the available art, the present invention provides novel linearized circuitry for a power amplifier that is free from the above-identified problems related to the prior art predistortion schemes (10 of FIG. 1A and 30 of FIG. 1B).

One aspect of the present invention is directed to an apparatus and method for improving linearity of an RF signal. In one embodiment, the apparatus of the present invention comprises: (a) a splitter; (b) an over-biased non-linear RF power amplifier; (c) an under-biased non-linear RF power amplifier; (d) a combiner; (e) a bias controller; and (f) a circulator.

In one embodiment of the present invention, the splitter is configured to receive an input RF signal, and configured to split the input RF signal into two RF signals comprising a first input RF signal, and a second input RF signal.

In one embodiment of the present invention, the over-biased non-linear RF power amplifier is configured to receive the first input RF signal and configured to generate an over-biased non-linear output signal having an over-biased non-linear distortion component. The over-biased non-linear RF power amplifier is configured to receive an over-biased DC signal being greater than an optimum bias DC voltage.

In one embodiment of the present invention, the under-biased non-linear RF power amplifier is configured to receive the second input RF signal and configured to generate an under-biased non-linear output signal having an under-biased non-linear distortion component. The under-biased non-linear RF power amplifier is configured to receive an under-biased DC signal being lower than the optimum bias DC voltage. In one embodiment of the present invention, the combiner is configured to combine the over-biased non-linear output signal and the under-biased non-linear output signal.

In one embodiment of the present invention, the bias controller is configured to keep the over-biased DC signal greater than the optimum bias DC voltage by an over_biased DC value. In one embodiment of the present invention, the bias controller is configured to keep the under-biased DC signal lower than the optimum bias DC voltage by an under_biased DC value.

In one embodiment of the present invention, the bias controller is configured to keep the over_biased DC value substantially equal to the under_biased DC value so that the over-biased non-linear distortion component and the under-biased non-linear distortion component are substantially cancelled. In this embodiment, the combiner outputs an RF signal having the substantially cancelled over-biased non-linear distortion component and having the substantially cancelled under-biased non-linear distortion component.

In one embodiment of the present invention, the bias controller further comprises an analog bias controller. In another embodiment of the present invention, the bias controller further comprises a digital bias controller.

In one embodiment of the present invention, the circulator is configured to pass without an additional loss the RF power signal having the substantially cancelled over-biased non-linear distortion component and having the substantially cancelled under-biased non-linear distortion component to an output of the apparatus. The circulator is also configured to substantially suppress an RF power signal reflected from the output of the apparatus and is configured to substantially prevent the reflected RF signal from entering the apparatus.

In one embodiment, the apparatus of the present invention for improving linearity of an RF signal further includes an over-biased DC circuit configured to generate the over-biased DC signal being greater than the optimum bias DC voltage. In one embodiment, the apparatus of the present invention for improving linearity of an RF signal further includes an under-biased DC circuit configured to generate the under-biased DC signal being lower than the optimum bias DC voltage.

In one embodiment of the present invention, the over-biased DC circuit further includes an over-biased temperature control circuit further including: (1) a temperature sensor circuit configured to measure temperature fluctuations; and (2) an over-biased temperature compensation circuit configured to compensate the over-biased DC circuit for the measured temperature fluctuations.

In one embodiment of the present invention, the under-biased DC circuit further includes an under-bias&d temperature control circuit further including: (1) a temperature sensor circuit configured to measure temperature fluctuations; and (2) an under-biased temperature compensation circuit configured to compensate the under-biased DC circuit for the measured temperature fluctuations.

In one embodiment of the present invention, the temperature sensor circuit further includes an active semiconductor device including a threshold voltage. The threshold voltage depends on the temperature fluctuations, and the active semiconductor device generates a DC voltage signal that depends on the threshold voltage. In one embodiment of the present invention, the active semiconductor device further includes at least one diode. In another embodiment of the present invention, the active semiconductor device further includes at least one transistor.

In one embodiment of the present invention, the temperature sensor circuit further includes at least one thermistor, wherein the thermistor changes its resistance depending on the temperature fluctuations.

In one embodiment of the present invention, the over-biased temperature compensation circuit further includes: (1) an analog (or digital) potentiometer configured to generate an analog (or digital) reference over-biased voltage signal, and (2) an operational amplifier configured to sum a difference between the analog (digital) reference over-biased voltage signal and a signal that depends on the temperature fluctuations. The operational amplifier is configured to generate a temperature-over-biased-control-voltage signal in order to keep the analog (digital) reference over-biased voltage signal substantially the same over a substantially broad temperature range.

In one embodiment of the present invention, the under-biased temperature compensation circuit further includes: (1) an analog (digital) potentiometer configured to generate an analog (digital) reference under-biased voltage signal, and (2) an operational amplifier configured to sum a difference between the analog (digital) reference under-biased voltage signal and a signal that depends on the temperature fluctuations. The operational amplifier is configured to generate a temperature-under-biased-control-voltage signal in order to keep the analog (digital) reference under-biased voltage signal substantially the same over a substantially broad temperature range.

In one embodiment, the apparatus of the present invention for improving linearity of an RF signal further comprises an adaptive loop configured to minimize the residual distortion component. In one embodiment of the present invention, the adaptive loop further comprises an analog feedback loop. In another embodiment of the present invention, the adaptive loop further comprises a digital feedback loop. In one more embodiment of the present invention, the adaptive loop further comprises a digital feedforward loop.

In one embodiment of the present invention, the adaptive bias feedback loop further includes: (1) a distortion sensor configured to measure the residual distortion signal, and configured to generate a distortion sensor signal proportional to the residual distortion signal, and (2) an adaptive bias controller configured under control of the distortion sensor signal to change the under-biased DC signal and configured to change the over-biased DC signal in order to minimize the residual distortion signal.

In one embodiment of the present invention, the adaptive bias controller further includes a programmable digital bias controller configured to pre-set a programmable minimum residual distortion level. In another embodiment of the present invention, the adaptive bias controller further includes a programmable digital bias controller programmed to minimize the programmable minimum residual distortion level to accommodate for a set of external parameters selected from the group consisting of: {an outside temperature level, an output power level, and a frequency range of the apparatus}.

Another aspect of the present invention is directed to a method for improving linearity of an RF signal. In one embodiment, the method comprises the following steps: (a) receiving an input RF signal and splitting the input RF signal into two RF signals by utilizing a splitter, the two RF signals comprising a first input RF signal, and a second input RF signal; (b) generating an over-biased non-linear output signal having an over-biased non-linear distortion component by using an over-biased non-linear RF power amplifier; (c) generating an under-biased non-linear output signal having an under-biased non-linear distortion component by using an under-biased non-linear RF power amplifier; (d) combining the over-biased non-linear output signal and the under-biased non-linear output signal by using a combiner; (e) outputting an RF signal having a residual distortion component; (f) substantially suppressing an RF power signal reflected from an output of the apparatus and substantially preventing the reflected RF signal from entering the apparatus by using a circulator; and (g) minimizing the residual distortion component by using an adaptive loop.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 2:
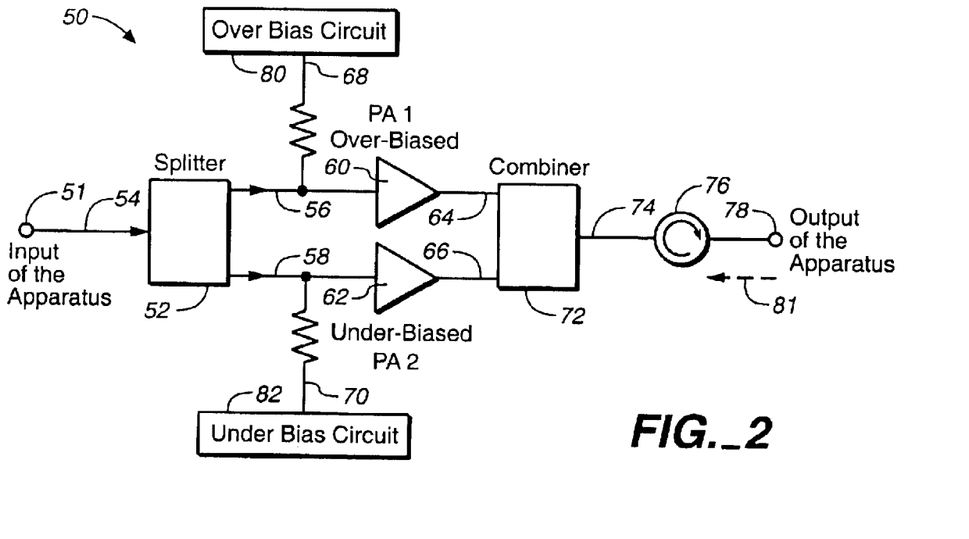
FIG. 2 depicts an apparatus of the present invention for improving linearity of an RF signal.

FIG. 2 depicts an apparatus 50 of the present invention for improving linearity of an RF signal. In one embodiment, the apparatus 50 comprises a splitter 52 configured to receive an input RF signal 54, and configured to split the input RF signal 54 into two RF signals: a first input RF signal 56, and a second input RF signal 58. It is well known to a person skilled in the art how to implement the splitter 52 with above identified function of splitting the input signal into two signals.

Pico Macom, Inc., based in San Fernando, Calif., manufactures high frequency splitters in the frequency range of (950–2150) MHz, as well as power passing splitters, that can be used to implement the present invention, In one embodiment of the present invention, the apparatus 50 further comprises an over-biased non-linear RF power amplifier PA1 60 configured to receive the first input RF signal 58 and configured to generate an over-biased non-linear output signal 64 having an over-biased non-linear distortion component. The over-biased non-linear RF power amplifier PA1 60 is configured to receive an over-biased DC signal 68 being greater than an optimum bias DC voltage (please, see discussion below).

Referring still to FIG. 2, in one embodiment of the present invention, the apparatus 50 further comprises an under-biased non-linear RF power amplifier PA2 62 configured to receive the second input RF signal 58 and configured to generate an under-biased non-linear output signal 66 having an under-biased non-linear distortion component. The under-biased non-linear RF power amplifier PA2 62 is configured to receive an under-biased DC signal 70 being lower than the optimum bias DC voltage (please, see discussion below). Raytheon RF Components, Inc., located in Andover, Mass., manufactures power and driver amplifiers in the frequency range (800–2000) MHz suitable for implementation of the present invention.

Referring still to FIG. 2, in one embodiment of the present invention, the apparatus 50 further comprises a combiner 72 electrically communicating with the over-biased non-linear RF power amplifier PA1 60, and electrically communicating with the under-biased non-linear RF power amplifier PA2 62. The combiner 72 is configured to combine the over-biased non-linear output signal 64 and the under-biased non-linear output signal 66 to produce the output signal 74.

The combiner 72 can be implemented by using any combiner technology. This includes 90 degree hybrid dividers/combiners, in phase Wilkerson dividers/combiners, hard parallel dividing/combining, 180 degree dividers/ combiners using either 180 degree phase line or baluns, any phase shift combining where one side has a phase shift of "Y" degrees on the input and the other side has a phase shift of "Y" degrees on the output. All of the dividers/combiners can be realized using microstrip, stripline, coax transmission line, twisted pair wires, torodial transformers or any combination thereof. Mega Electronics. Inc., located in Denville, N.J., manufactures a comprehensive selection of 2-way through 16-way power dividers and combiners for frequencies from 0.6 to 4.2 GHz for narrow, octave, dual and multi-octave band applications.

Referring still to FIG. 2, in one embodiment of the present invention, the apparatus 50 further comprises a circulator 76 electrically communicating with the combiner 74. The circulator 76 is configured to pass without an additional loss the RF power signal 74 having the substantially cancelled over-biased non-linear distortion component and the substantially cancelled under-biased non-linear distortion component to an output 78 of the apparatus 50. The circulator 76 is configured to substantially suppress an RF power signal 80 (shown as a dashed line) reflected from the output 78 of the apparatus 50 and is configured to substantially prevent the reflected RF signal 80 from entering the apparatus 50. Dorado International Corporation located in Seattle, Wash., manufactures a big selection of ferrite devices including ferrite waveguide switches, including circulators and couplers.

Referring still to FIG. 2, in one embodiment of the present invention, the apparatus 50 further comprises an over-biased DC circuit 80 configured to generate the over-biased DC signal 68 being greater than the optimum bias DC voltage. In one embodiment of the present invention, the apparatus 50 further comprises an under-biased DC circuit 82 configured to generate the under-biased DC signal 70 being lower than the optimum bias DC voltage.

Figure 3A:
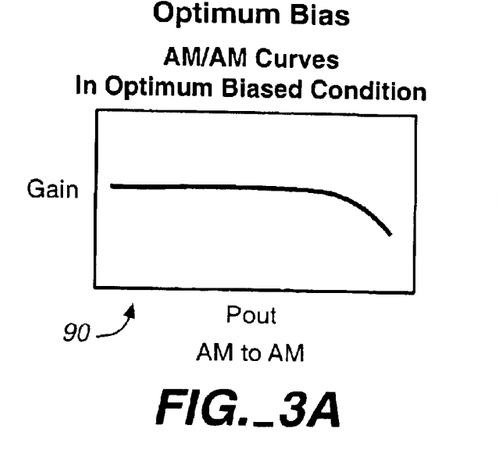
FIG. 3A illustrates AM-to-AM gain curve for the optimum bias point.
Figure 3B:
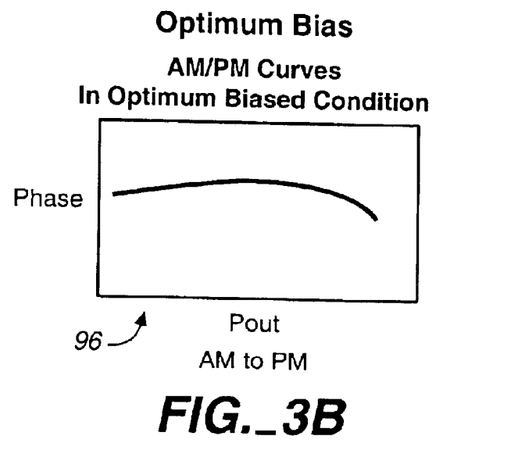
FIG. 3B shows AM-to-PM phase curve for the optimum bias point.

In the present invention, the offset bias technique is used for amplifier linearization. Most high power RF amplifiers are being biased in a Class AB mode to deliver high power with reasonable efficiency and linearity. Class AB bias puts a voltage on the gate/base of the transistor that is greater than the threshold voltage ($V_{threshold}$) causing the transistor to conduct a small amount of current with no RF applied. The Class AB bias mode produces a conduction angle that is greater than 180 degrees but less than 360 degrees. Because the transistor does not conduct for the full 360 degrees, distortion is generated when complex signals are passed through the transistor. The amount of distortion depends on the bias point, the output power compared to the RF load line and the type of device used. In designing RF amplifiers in Class AB mode, an optimum bias point is found that will produce the minimum AM-to-AM and AM-to-PM distortion. The AM-to-AM gain curve 90 for the optimum bias point is depicted in FIG. 3A. The AM-to-PM phase curve 96 for the optimum bias point is shown in FIG. 3B.

Even though a transistor is biased at its optimum point, it will still produce a certain amount of distortion when excited by a complex RF signal (Multi tones, Code Division Multiple Access (CDMA), WCDMA, OFDM, Time Division Multiple Access (TDMA), GSM/EDGE, etc). This kind of distortion interferes with the proper operation of the RF systems the amplifier is used in.

Figure 4A:
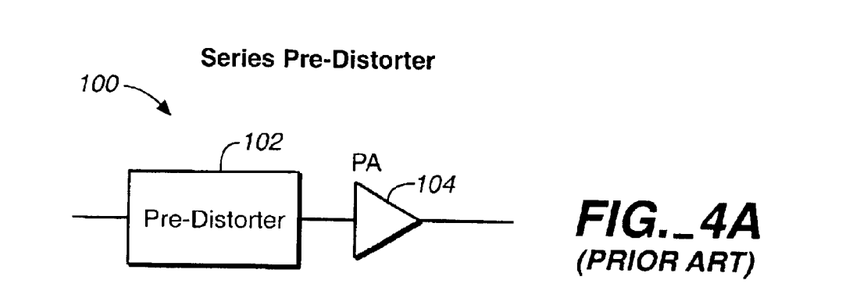
FIG. 4A depicts a prior art circuitry including a series predistorter that is used to produce distortion products that are out of phase with the distortion products generated in the power amplifier PA.

In one prior art circuitry 100 (shown in FIG. 4A), when power amplifier PA 104 is excited by a complex RF signal (not shown), a series predistorter 102 is used to produce distortion products that are out of phase with the distortion products generated in the amplifier PA 104. The problem with this technique is that it requires a separate predistorter 102. The predistorter typically induces 6 to 10 dB of insertion loss into the amplifier chain requiring more gain stages to be added to achieve the same amount of overall gain. Also, since the predistorters are generally not matched to the impedance of the output (50 ohms), an additional circuitry (not shown in FIG. 4A) is required to isolate the predistorter 102 rom the rest of the amplifier chain.

Figure 4B:
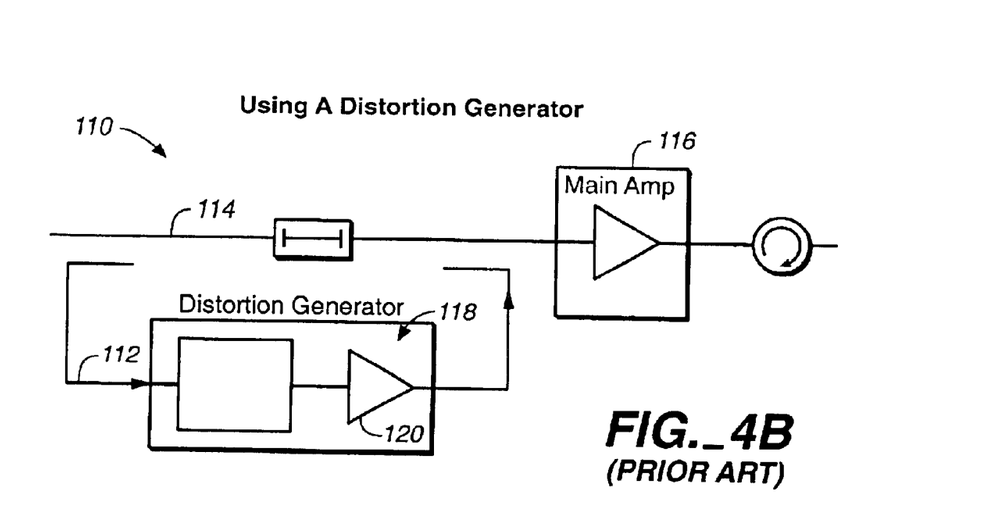
FIG. 4B illustrates a prior circuitry including a distortion generator that is used to create the distortion products in a separate path from the main path of the main amplifier.

FIG. 4B illustrates another prior circuitry 110 including a distortion generator 118 that is used to create the distortion products in a separate path 112 from the main path 114 of the main amplifier 116. The circuitry 110 of FIG. 4B reduces the insertion loss that the series predistorter (102 of FIG. 4A) creates, but requires an additional active device 120 to generate the distortion products at the correct level, thus increasing the complexity of the overall circuitry.

Figure 5A:
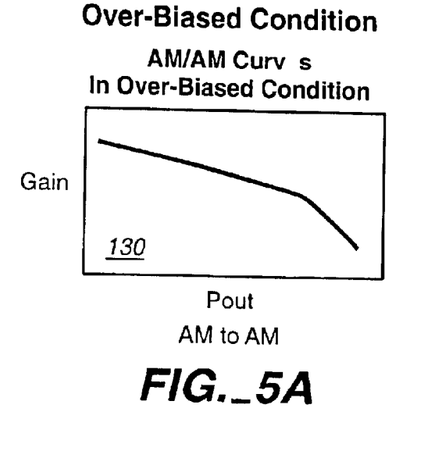
FIG. 5A illustrates how the over-biased PA1 causes gain compression of the input signal, because AM-to-AM curve of FIG. 3A has a negative slope when moving from optimum bias to over-bias.
Figure 5B:
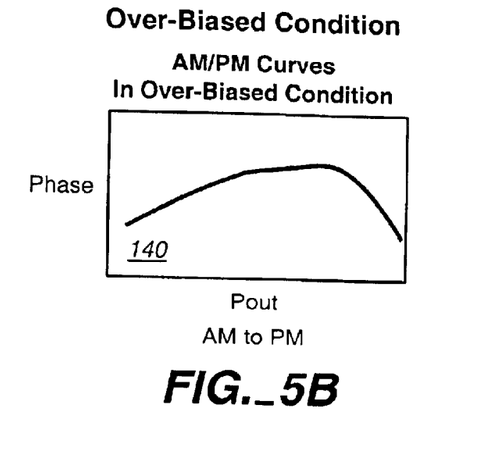
FIG. 5B shows how the over-biased PA1 causes the phase lead of the input signal, because AM-to-PM curve of FIG. 3B has a positive slope when moving from optimum bias to over-bias.

Referring still to FIG. 2, the apparatus 50 of the present invention utilizes a novel way to reduce the nonlinear distortions by creating equal but opposite distortion products in an RF amplifier PA1 60 and PA2 62 and then combining these products together in the combiner 72 such that they will cancel each other without reducing the original input signal. Starting with PA1 RF amplifier 60 at it optimum bias point, the optimum bias is varied to change its AM-to-AM and AM-to-PM characteristics in accordance with FIGS. 3A and 3B to become an over-bias. The over-biased PA1 causes gain compression of the input signal, because AM-to-AM curve of FIG. 3A has a negative slope 130 (as shown in FIG. 5A when moving from optimum bias to over-bias) and causes the phase lead of the input signal, because AM-to-PM curve has a positive slope 140 (as depicted in FIG. 5A when moving from optimum bias to over-bias).

Figure 6A:
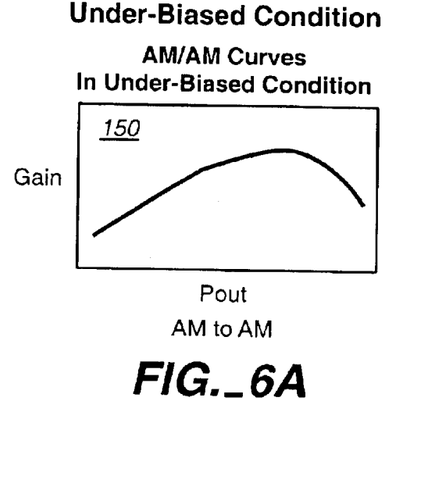
FIG. 6A depicts how the under-biased PA2 causes gain expansion of the input signal, because AM-to-AM curve of FIG. 3A has a positive slope when moving from optimum bias to under-bias.
Figure 6B:
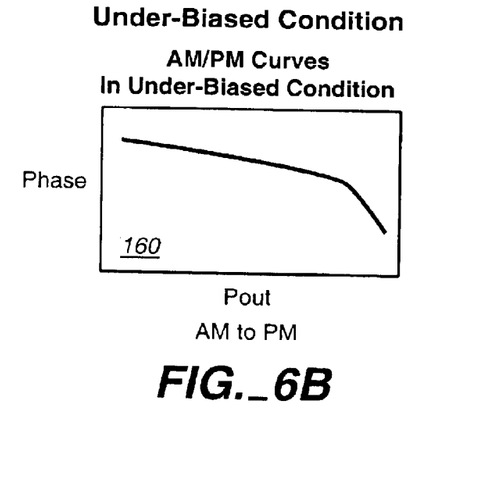
FIG. 6B shows how the under-biased PA2 causes the phase lag of the input signal, because AM-to-PM curve of FIG. 3B has a negative slope when moving from optimum bias to under-bias.

Similarly, starting with PA2 RF amplifier 62 at it optimum bias point, the optimum bias is varied to change its AM-to-AM and AM-to-PM characteristics in accordance with FIGS. 3A and 3B to become an under-bias. The under-biased PA2 causes gain expansion of the input signal, because AM-to-AM curve of FIG. 3A has a positive slope 150 (as shown in FIG. 6A when moving from optimum bias to under-bias) and causes the phase lag of the input signal, because AM-to-PM curve has a negative slope 160 (as illustrated in FIG. 6B when moving from optimum bias to under-bias).

Figure 7A:
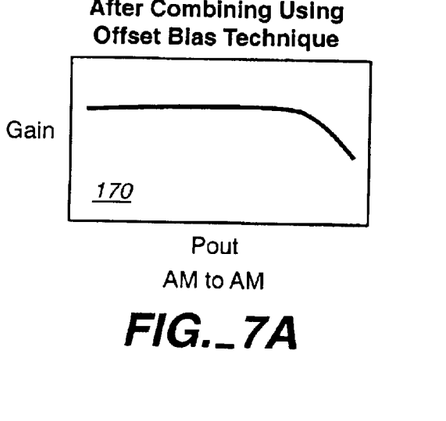
FIG. 7A depicts the gain curve of the apparatus of FIG. 2 of the present invention which is linear within broad range of output powers.
Figure 7B:
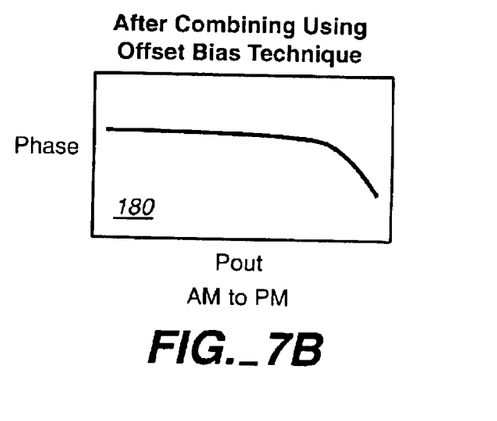
FIG. 7B illustrates the phase curve of the apparatus of FIG. 2 of the present invention which is quasi-linear within broad range of output powers.

Referring still to FIG. 2, the apparatus 50 of the present invention includes the amplifier PA1 60 biased in an over-biased condition and the amplifier PA2 62 biased in an under-biased condition. The output signals 64 and 66 are then combined together in the combiner 72. The circuitry 50 of FIG. 2 includes the gain curve 170 which is linear within broad range of output powers (as shown in FIG. 7A), and the phase curve 180 which is quasi-linear within broad range of output powers (as shown in FIG. 7B).

Figure 8A:
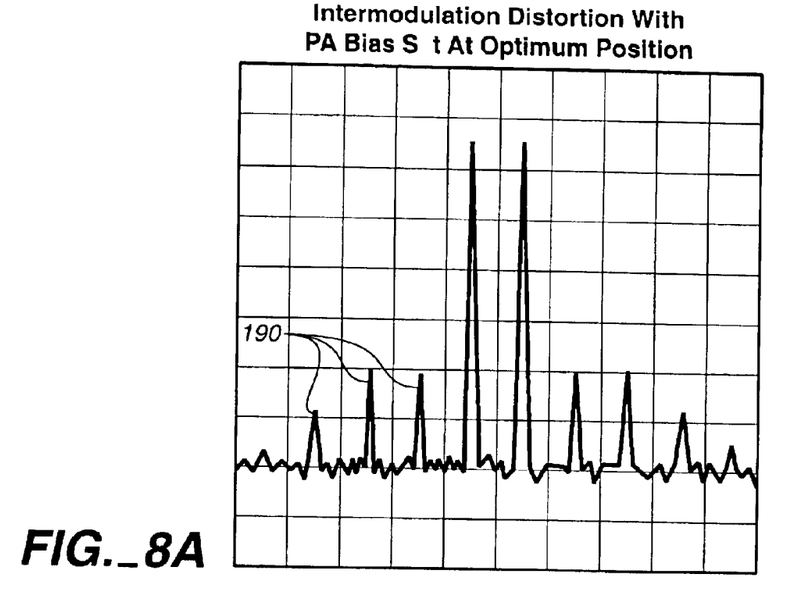
FIG. 8A shows the intermodulation distortion (IMD) produced by the apparatus of the present invention of FIG. 2 including both RF amplifiers PA1 and PA2 optimally biased.
Figure 8B:
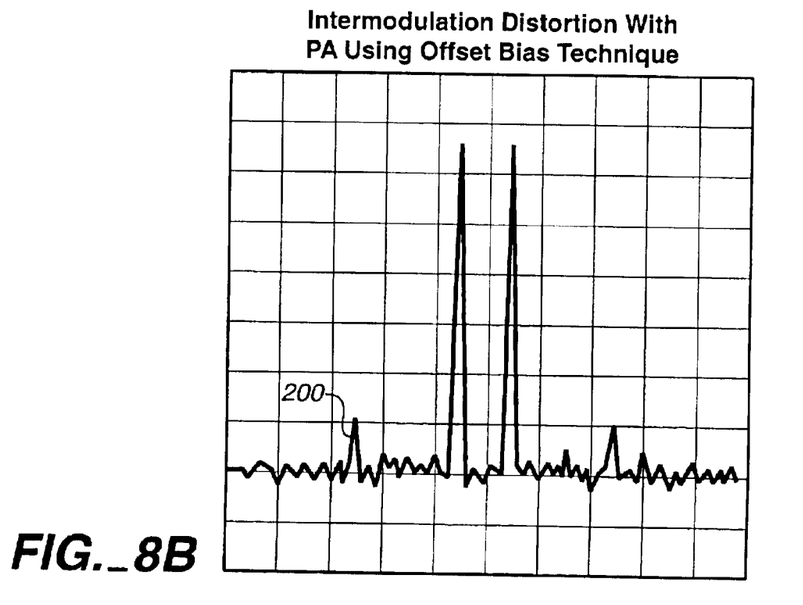
FIG. 8B depicts the reduced intermodulation distortion (IMD) produced by the apparatus of the present invention of FIG. 2 including half of the amplifiers in an under-biased condition and the other half in the over-biased condition.

Looking at the two tone performance of the apparatus 50 (of FIG. 2), FIG. 8A shows the levels 190 of intermodulation distortion (IMD) produced by the apparatus 50 including both RF amplifiers PA1 and PA2 optimally biased. On the other hand, by placing one half of the amplifiers in an under-biased condition and the other half in the over-biased condition, the intermodulation distortion IMD at levels 190 of FIG. 8A is reduced to the level 200 shown in FIG. 8B. This technique actually increases the amount of distortion each power amplifier PA1 60 (of FIG. 2) and PA2 62 (of FIG. 2) will produce, but since PA1 and PA2 are out of phase with each other, when combined together they produce an amplifier circuitry having better linearity. This technique can be applied to all types of transistors including Silicon Bipolar, Silicon LDMOS FETs, GaAs HBTs, GaAs MESFETs, Silicon Carbide FETs or Bipolars, Gallium Nitride FETs or Bipolar.

Referring still to FIG. 2, because of the physics of transistors, the $V_{threshold}$ of the device will change with temperature. In order to maintain the same relationship of AM-to-AM and AM-to-PM for each amplifier PA1 60 and PA2 62, some type of temperature control circuit should be used.

Figure 9A:
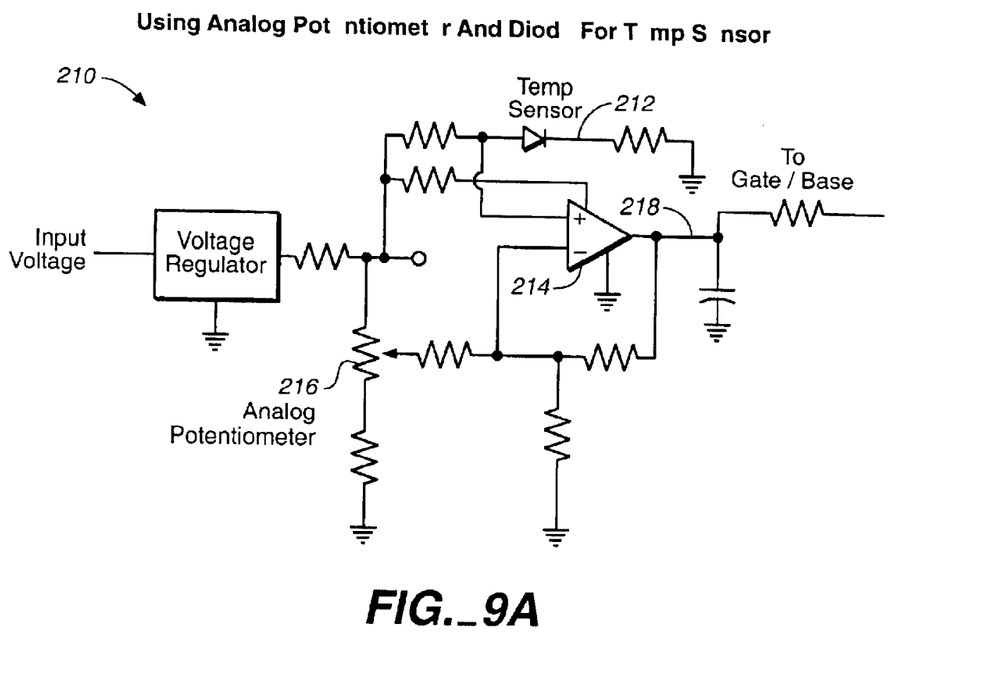
FIG. 9A depicts a bias temperature control circuit further including a temperature sensor circuit including a diode configured to measure temperature fluctuations, and a temperature compensation circuit further including an analog potentiometer configured to compensate the over-bias (or under-bias) voltage for the measured temperature fluctuations.

In one embodiment of the present invention, FIG. 9A depicts a bias temperature control circuit 210 further including a temperature sensor circuit configured to measure temperature fluctuations, and a bias temperature compensation circuit configured to compensate the over-biased (or under-biased) DC voltage for the measured temperature fluctuations.

In one embodiment of the present invention, the temperature sensor circuit of FIG. 9A further includes a diode 212. The diode 212 is an analog device configured to measure temperature fluctuations because its threshold voltage and its conductive properties depend on the temperature.

Figure 9B:
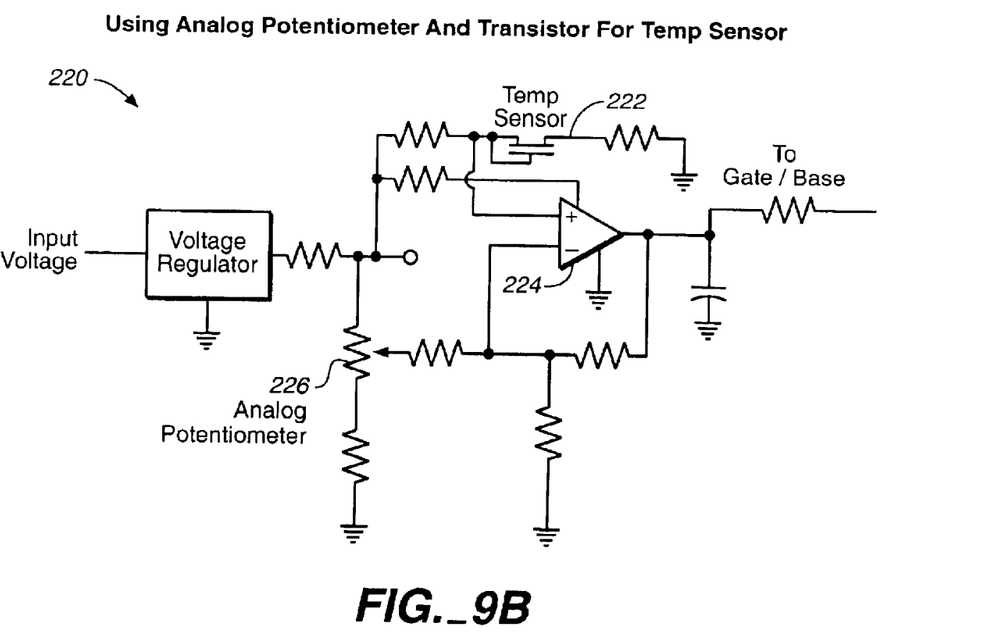
FIG. 9B illustrates a bias temperature control circuit further including a temperature sensor circuit including a transistor configured to measure temperature fluctuations, and a temperature compensation circuit further including an analog potentiometer configured to compensate the over-bias (or under-bias) voltage for the measured temperature fluctuations.

In another embodiment of the present invention, as shown in FIG. 9B, the bias temperature control circuit 220 includes a temperature sensor circuit further including a transistor 222. The transistor 222 is an analog device configured to measure temperature fluctuations because its threshold voltage and its conductive properties depend on the temperature. Texas Instruments Incorporated, located in Dallas, Tex., manufactures a large selection of diodes and transistors.

In one more embodiment of the present invention, the bias temperature control circuit includes a temperature sensor circuit further including at least one thermal resistor thermistor (not shown). A typical thermistor includes a resistive element that changes its electric properties due to temperature variations. There are two types of thermistors: a thermistor with PTC (Positive Temperature Coefficient), whereas its resistance will increase as temperature increases; and a thermistor with NTC (Negative Temperature Coefficient), whereas its resistance will decrease as temperature increases. Advanced Thermal Products, located in Str. Mary, Pa., manufactures a large selection of thermistors of both types PTC and NTC.

Referring still to FIG. 9A, in one embodiment of the present invention, the temperature compensation circuit 210 of FIG. 9A further includes an analog potentiometer 216 configured to generate an analog reference over-biased (or under-biased) voltage signal and an operational amplifier 214 configured to sum a difference between the analog reference over-biased (or under-biased) voltage signal and a signal that depends on the temperature fluctuations. The operational amplifier 214 is configured to generate a temperature-biased-control-voltage signal 218 in order to keep the power amplifier bias voltage signal 219 substantially the same over substantially broad temperature range. Polyshine Holdings, located in Dong-Guan City, China, manufactures a broad selection of analog potentiometers. Intersil Corporation, located un Melbourne, Fla., manufactures a large selection of operational amplifiers.

Figure 9C:
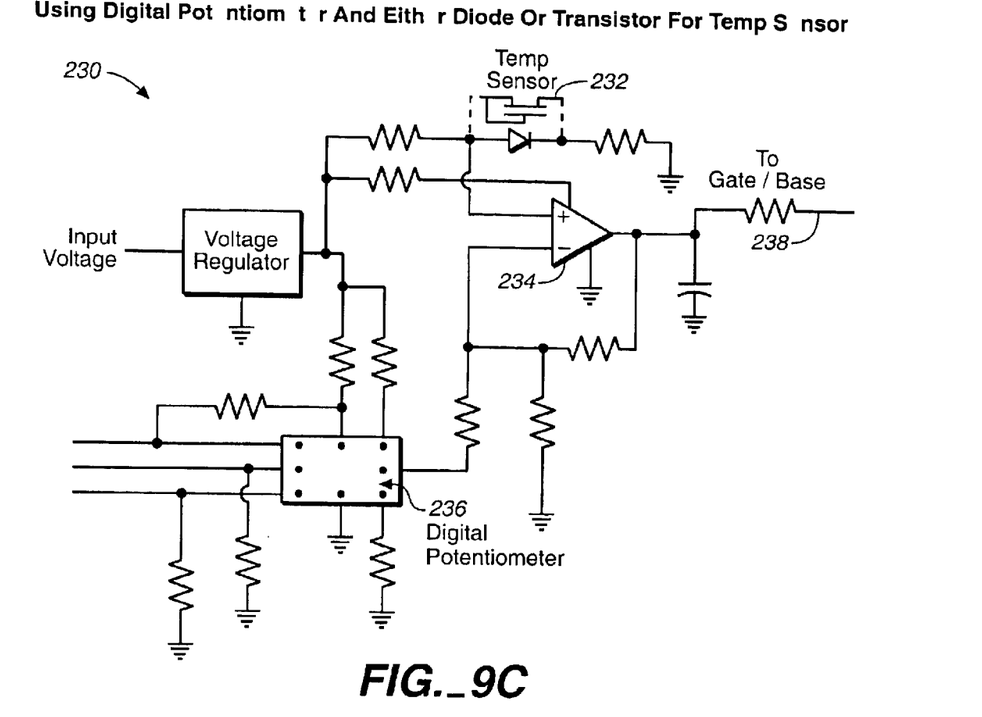
FIG. 9C shows a bias temperature control circuit further including a temperature sensor circuit including a diode (or transistor) configured to measure temperature fluctuations, and a temperature compensation circuit further including a digital potentiometer configured to compensate the over-bias (or under-bias) voltage for the measured temperature fluctuations.

In one embodiment of the present invention, shown in FIG. 9C, the temperature compensation circuit 230 further includes a digital potentiometer 236 configured to generate a digital reference over-biased (or under-biased) voltage signal, and an operational amplifier 234 configured to sum a difference between the digital reference over-biased (or under-biased) voltage signal and a signal that depends on the temperature fluctuations. The operational amplifier 234 is configured to generate a temperature-biased-control-voltage signal 236 in order to keep the digital reference over-biased (or under-biased) voltage signal 238 substantially the same over a broad temperature range. Analog Devices, located in Norwood, Mass., manufactures a large selection of digital potentiometers.

Figure 10:
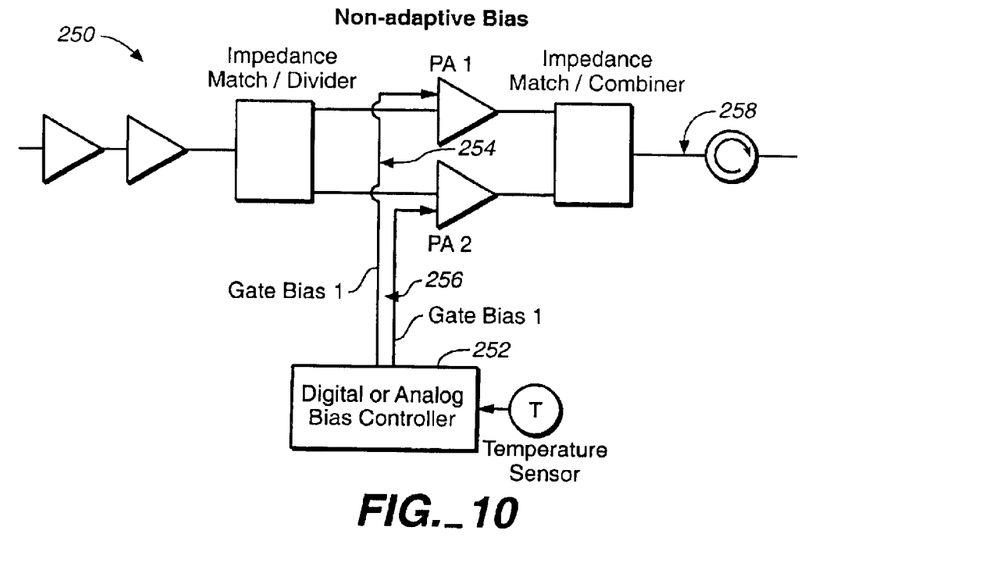
FIG. 10 illustrates the apparatus of the present invention for improving linearity of an RF signal of FIG. 2 further including a bias controller circuitry.

In one embodiment of the present invention, FIG. 10 illustrates the apparatus 250 that includes the apparatus 50 of FIG. 2 further including a bias controller 252. In one embodiment of the present invention, the bias controller 252 is configured to keep the over-biased DC signal 254 greater than the optimum bias DC voltage by an over_biased DC value (not shown). In one embodiment of the present invention, the bias controller 252 is configured to keep the under-biased DC signal 256 lower than the optimum bias DC voltage by an under_biased DC value (not shown). The bias controller 252 is configured to keep the over_biased DC value substantially equal to the under_biased DC value so that the over-biased non-linear distortion component and the under-biased non-linear distortion component are substantially cancelled. If this is the case, the combiner outputs an RF signal 258 having substantially cancelled over-biased non-linear distortion component and having substantially cancelled under-biased non-linear distortion component.

In one embodiment of the present invention, the bias controller 252 (of FIG. 10) further comprises a non-adaptive analog bias controller. In another embodiment of the present invention, the bias controller 252 (of FIG. 10) further comprises a non-adaptive digital bias controller. In one embodiment of the present invention, a non adaptive digital controller such as a lookup table is used to adjust the gate bias voltage (of the power amplifier) as the temperature changes. In one embodiment of the present invention, the lookup table is programmed with data that optimizes the gate bias at various temperatures to produce the maximum distortion cancellation. Microchip Technology, Inc., based in San Jose, Calif., manufactures a broad selection of analog and digital controllers.

Figure 11:
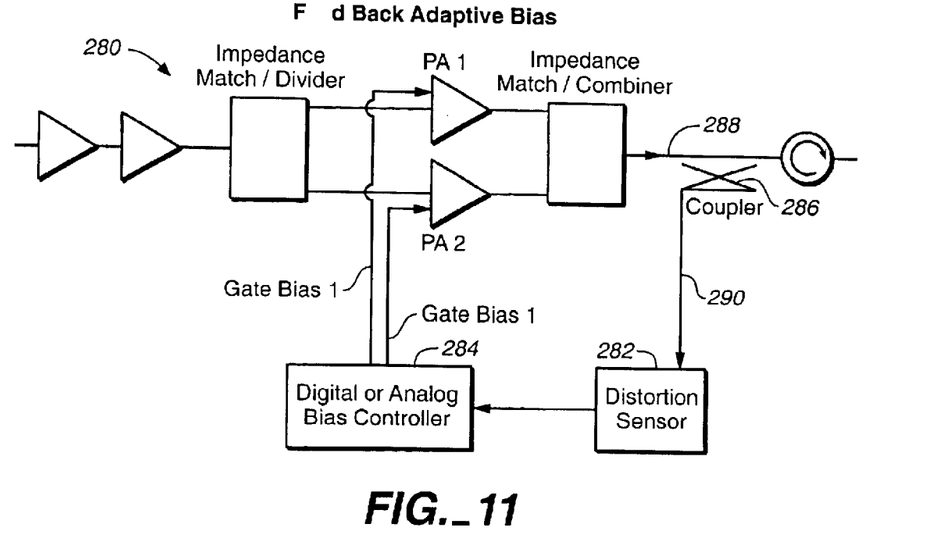
FIG. 11 depicts the apparatus of the present invention for improving linearity of an RF signal of FIG. 2 further including an adaptive control loop configured to minimize the residual distortion component.

In one embodiment of the present invention, as shown in FIG. 11, the apparatus for improving linearity of an RF signal 280 comprises the apparatus 250 of FIG. 10 further including an adaptive control loop configured to minimize the residual distortion component.

Referring still to FIG. 11, in one embodiment of the present invention, the adaptive loop comprises an analog feedback loop further including a coupler 286 configured to reflect the output RF signal 288 back to the distortion sensor 282, and an analog bias controller 284. In another embodiment of the present invention, the adaptive loop comprises a digital feedback loop further including a coupler 286 configured to reflect the output RF signal 288 back to the distortion sensor 282, and a digital bias controller 284.

In one embodiment, the distortion sensor 282 measures the residual distortion in the reflected output signal 290 by performing RMS (root mean square) detection operation, that is by measuring an average power for complex wave form.

Figure 12:
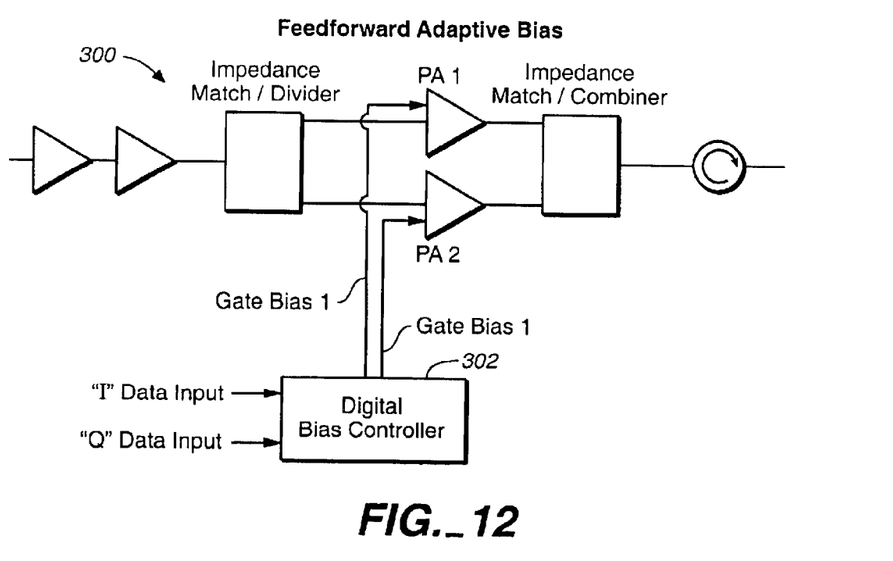
FIG. 12 illustrates the apparatus of the present invention for improving linearity of an RF signal of FIG. 2 further including a feedforward digital bias controller configured to minimize the residual distortion component.

In one embodiment of the present invention, as shown in FIG. 12, the apparatus for improving linearity of an RF signal 300 comprises the apparatus 50 of FIG. 2 further including a feedforward digital bias controller 302 configured to minimize the residual distortion component. In one embodiment, the feedforward digital bias controller 302 further includes a programmable digital bias controller configured to pre-set a programmable minimum residual distortion level. In another embodiment of the present invention, the feedforward digital bias controller 302 (of FIG. 12) further includes a programmable digital bias controller programmed to minimize the programmable minimum residual distortion level to accommodate for a set of external parameters selected from the group consisting of: {an outside temperature level, an output power level, and a frequency range of the apparatus}.

Figure 13:
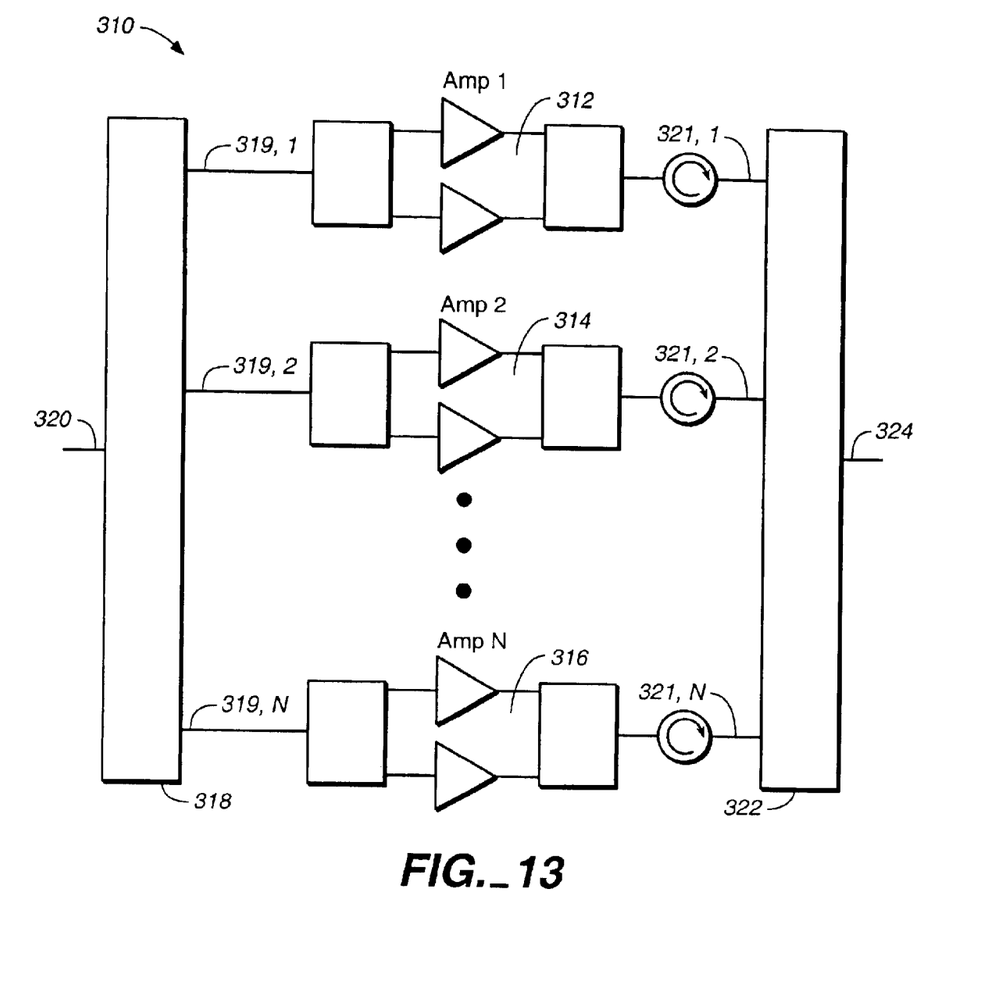
FIG. 13 depcist an apparatus of the present invention for improving linearity of an RF signal comprising a plurality of N identical apparatuses of FIG. 2.

In one embodiment of the present invention, FIG. 13 depicts an apparatus for improving linearity of an RF signal 210 comprising a main splitter 318 configured to split an input RF signal 320 into a plurality of N local input RF signals (319,1; 319,2; ... 319,N), a plurality of N identical complimentary biased pairs of amplifiers (312, 314, ..., 316), and a main combiner 322 configured to combine each local RF output power signal (321,1; 321,2; ... 321,N) in order to generate an output RF power signal 324 having substantially cancelled nonlinear distortion component. N is an integer. In one embodiment, each complimentary biased pair further comprises the apparatus 50 of FIG. 2.

Figure 14:
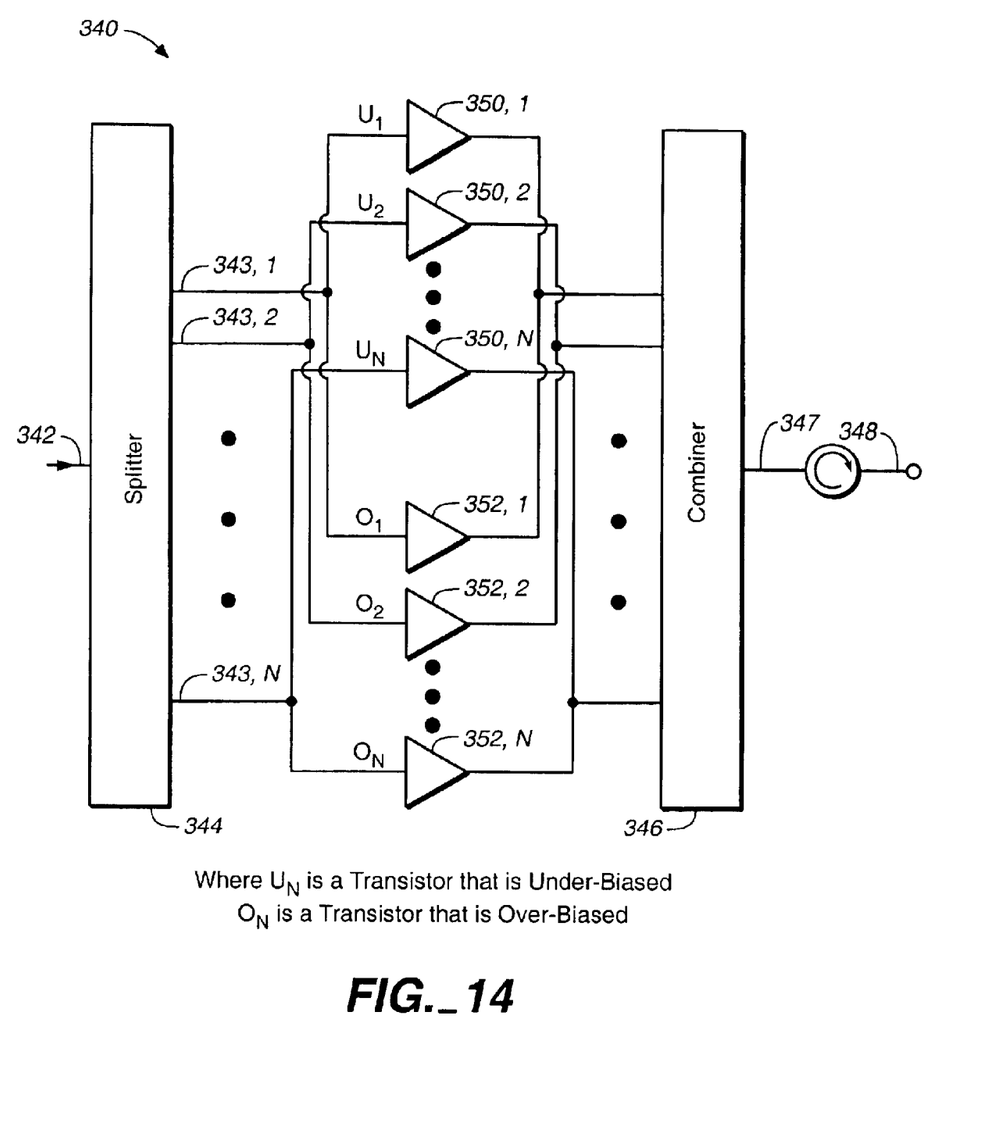
FIG. 14 illustrates an apparatus of the present invention for improving linearity of an RF signal comprising a main splitter configured to split an input RF signal into a plurality of N local input RF signals, a plurality of N complimentary biased pairs of amplifiers, and a main combiner.

In one embodiment of the present invention, FIG. 14 illustrates an apparatus 340 for improving linearity of an RF signal comprising a main splitter 342 configured to split an input RF signal 342 into a plurality of N local input RF signals (343,1; 343,2; ... 342,N), a plurality of N complimentary biased pairs of amplifiers (350,1 & 352,1; 350,2 & 352,2; ... 350,N & 352,N) and a main combiner 346. N is an integer.

In one embodiment, each complimentary biased pair of amplifiers further comprises: an under-biased unit $U_i$ (for instance, 350,1) configured to generate an under-biased non-linear output signal $(LU)_I$ having an under-biased non-linear distortion component $(\delta U)_i$; an over-biased unit $O_i$ (for instance, 352,1) configured to generate an over-biased non-linear output signal $(LO)_I$ having an over-biased non-linear distortion component $(\delta O)_i$; and a local combiner (not shown).

In one embodiment of the present invention, the absolute value of the under-biased non-linear distortion component $|(\delta U)_i|$ and an absolute value of the over-biased non-linear distortion component $|(\delta O)_i|$ are substantially equal. In this embodiment, the local combiner is configured to output a local output RF signal $L_i$ having the under-biased non-linear distortion component $(\delta U)_i$ and having the over-biased non-linear distortion component $(\delta O)_i$; wherein the under-biased non-linear distortion component $(\delta U)_i$ and the over-biased non-linear distortion component $(\delta O)_i$ are substantially cancelled. 'i' is an integer less or eqaul to N. The main combiner is configured to combine each local output RF signal $L_i$ having substantially cancelled distortion component in order to generate an RF output power 347 signal having substantially cancelled distortion component. 'i' is an integer less or eqaul to N.

In one embodiment, the apparatus 342 of FIG. 14 further comprises a circulator 348 configured to pass without an additional loss the RF output power signal 347 having the substantially cancelled distortion component to an output 350 of the apparatus 340. The circulator 348 is configured to substantially suppress an RF power signal 352 reflected from the output 350 of the apparatus 340, and is configured to substantially prevent the reflected RF power signal 352 from entering the apparatus 340.

The following procedure describes how to align a pair of power amplifiers that uses the described above offset bias technique to minimize the predistortion components.

At the first step, the DC bias of the power amplifier is initially set at the standard optimum bias point as described above. No RF power is applied at this time. Once the optimum bias is set, the two tone RF unmodulated carriers are applied to the amplifier. The output IMDs (inter modulation distortions) of the amplifier is monitored on the Spectrum Analyzer.

At the next step, the bias is continuously increased to the over-biased amplifier while watching the output IMDs, until the output IMDs are no longer decreasing. The bias to the under-biased amplifier is continuously decreased until the output IMDs are no longer decreasing.

At the next step, the bias to the over-biased amplifier is adjusted (decreased or increased) while watching the output IMDs, until the output IMDs are no longer decreasing. The bias to the under-biased amplifier is adjusted (decreased or increased) until the output IMDs are no longer decreasing.

At the next step, the optimum bias of the amplifier is determined as the bias where the gain expansion/compression of the amplifier is minimized over the operating region prior to the amplifier going into compression mode due to the saturated power capability of the amplifier. Gain expansion/compression is a type of AM-to-AM distortion. The optimum bias point will produce a gain vs. power out curve similar to the curve of FIG. 3A.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus for improving linearity of an RF signal comprising:
    a splitter configured to receive an input RF signal, and configured to split said input RF signal into two RF signals comprising a first input RF signal, and a second input RF signal;
    an over-biased non-linear RF power amplifier configured to receive said first input RF signal and configured to generate an over-biased non-linear output signal having an over-biased non-linear distortion component; said over-biased non-linear RF power amplifier configured to receive an over-biased DC signal being greater than an optimum bias DC voltage;
    an under-biased non-linear RF power amplifier configured to receive said second input RF signal and configured to generate an under-biased non-linear output signal having an under-biased non-linear distortion component; said under-biased non-linear RF power amplifier configured to receive an under-biased DC signal being lower than said optimum bias DC voltage; and
    a combiner electrically communicating with said over-biased non-linear RF power amplifier, and electrically communicating with said under-biased non-linear RF power amplifier; said combiner configured to combine said over-biased non-linear output signal and said under-biased non-linear output signal.

2. The apparatus of claim 1 further including:
    a bias controller;
    wherein said bias controller is configured to keep said over-biased DC signal greater than said optimum bias DC voltage by an over_biased DC value;
    and wherein said bias controller is configured to keep said under-biased DC signal lower than said optimum bias DC voltage by an under_biased DC value;
    and wherein said bias controller is configured to keep said over_biased DC value substantially equal to said under_biased DC value so that said over-biased non-linear distortion component and said under-biased non-linear distortion component are substantially cancelled;
    and wherein said combiner outputs an RF signal having said substantially cancelled over-biased non-linear distortion component and said substantially cancelled under-biased non-linear distortion component.

3. The apparatus of claim 2, wherein said bias controller further comprises:
    an analog bias controller.

4. The apparatus of claim 2, wherein said bias controller further comprises:
    a digital bias controller.

5. The apparatus of claim 2 further comprising:
    a circulator electrically communicating with said combiner;
    wherein said circulator is configured to pass without an additional loss said RF power signal having said substantially cancelled over-biased non-linear distortion component and said substantially cancelled under-biased non-linear distortion component to an output of said apparatus;
    and wherein said circulator is configured to substantially suppress an RF power signal reflected from said output of said apparatus and is configured to substantially prevent said reflected RF signal from entering said apparatus.

6. The apparatus of claim 1 further including:
    an over-biased DC circuit configured to generate said over-biased DC signal being greater than said optimum bias DC voltage.

7. The apparatus of claim 1 further including:
    an under-biased DC circuit configured to generate said under-biased DC signal being lower than said optimum bias DC voltage.

8. The apparatus of claim 6 further including:
    an over-biased temperature control circuit further including:
        a temperature sensor circuit configured to measure temperature fluctuations; and
        an over-biased temperature compensation circuit electrically communicating with said temperature sensor circuit; said over-biased temperature compensation circuit configured to compensate said over-biased DC circuit for said measured temperature fluctuations.

9. The apparatus of claim 7 further including:
    an under-biased temperature control circuit further including:
        a temperature sensor circuit configured to measure temperature fluctuations; and
        an under-biased temperature compensation circuit electrically communicating with said temperature sensor circuit; said under-biased temperature compensation circuit configured to compensate said under-biased DC circuit for said measured temperature fluctuations.

10. The apparatus of claim 8, wherein said temperature sensor circuit further includes:
    an active semiconductor device including a threshold voltage, wherein said threshold voltage depends on said temperature fluctuations, and wherein said active semiconductor device generates a DC voltage signal that depends on said threshold voltage.

11. The apparatus of claim 10, wherein said active semiconductor device further includes:
    at least one diode.

12. The apparatus of claim 10, wherein said active semiconductor device further includes:
    at least one transistor.

13. The apparatus of claim 8, wherein said temperature sensor circuit further includes:
    at least one thermistor, wherein said thermistor changes its resistance depending on said temperature fluctuations.

14. The apparatus of claim 8, wherein said over-biased temperature compensation circuit further includes:
    an analog potentiometer configured to generate an analog reference over-biased voltage signal; and
    an operational amplifier electrically communicating with said analog potentiometer;
    wherein said operational amplifier is configured to sum a difference between said analog reference over-biased voltage signal and a signal that depends on said temperature fluctuations;
    and wherein said operational amplifier is configured to generate a temperature-over-biased-control-voltage signal in order to keep said analog reference over-biased voltage signal substantially the same over a substantially broad temperature range.

15. The apparatus of claim 8, wherein said over-biased temperature compensation circuit further includes:
    a digital potentiometer configured to generate a digital reference over-biased voltage signal; and
    an operational amplifier electrically communicating with said digital potentiometer;
    wherein said operational amplifier is configured to sum a difference between said digital reference over-biased voltage signal and a signal that depends on said temperature fluctuations;
    and wherein said operational amplifier is configured to generate a temperature-over-biased-control-voltage signal in order to keep said digital reference over-biased voltage signal substantially the same over a substantially broad temperature range.

16. The apparatus of claim 9, wherein said under-biased temperature compensation circuit further includes:
    an analog potentiometer configured to generate an analog reference under-biased voltage signal; and
    an operational amplifier electrically communicating with said analog potentiometer;
    wherein said operational amplifier is configured to sum a difference between said analog reference under-biased voltage signal and a signal that depends on said temperature fluctuations;
    and wherein said operational amplifier is configured to generate a temperature-under-biased-control-voltage signal in order to keep said analog reference under-biased voltage signal substantially the same over a substantially broad temperature range.

17. The apparatus of claim 9, wherein said under-biased temperature compensation circuit further includes:
    a digital potentiometer configured to generate a digital reference under-biased voltage signal; and
    an operational amplifier electrically communicating with said digital potentiometer;
    wherein said operational amplifier is configured to sum a difference between said digital reference under-biased voltage signal and a signal that depends on said temperature fluctuations;
    and wherein said operational amplifier is configured to generate a temperature-under-biased-control-voltage signal in order to keep said digital reference under-biased voltage signal substantially the same over a substantially broad temperature range.

18. An apparatus for improving linearity of an RF signal comprising:
    a splitter configured to receive an input RF signal, and configured to split said input RF signal into two RF signals comprising a first input RF signal, and a second input RF signal;
    an over-biased non-linear RF power amplifier configured to receive said first input RF signal and configured to generate an over-biased non-linear output signal having an over-biased non-linear distortion component; said over-biased non-linear RF power amplifier configured to receive an over-biased DC signal being greater than an optimum bias DC voltage;
    an under-biased non-linear RF power amplifier configured to receive said second input RF signal and configured to generate an under-biased non-linear output signal having an under-biased non-linear distortion component; said under-biased non-linear RF power amplifier configured to receive an under-biased DC signal being lower than said optimum bias DC voltage;
    a combiner electrically communicating with said over-biased non-linear RF power amplifier, and electrically communicating with said under-biased non-linear RF power amplifier; said combiner configured to combine said over-biased non-linear output signal and said under-biased non-linear output signal; wherein said combiner is configured to output an RF signal having a residual distortion component;
    a circulator electrically communicating with said combiner; wherein said circulator is configured to pass without an additional loss said RF power signal having said residual distortion component to an output of said apparatus; and wherein said circulator is configured to substantially suppress an RF power signal reflected from said output of said apparatus and is configured to substantially prevent said reflected RF signal from entering said apparatus; and
    an adaptive loop configured to minimize said residual distortion component.

19. The apparatus of claim 18, wherein said adaptive loop further comprises:
    an analog feedback loop.

20. The apparatus of claim 18, wherein said adaptive loop further comprises:
    a digital feedback loop.

21. The apparatus of claim 18, wherein said adaptive loop further comprises:
    a digital feedforward loop.

22. The apparatus of claim 18, wherein said adaptive loop further includes:
    an adaptive bias feedback loop configured to minimize said residual distortion component.

23. The apparatus of claim 22, wherein said adaptive bias feedback loop further includes:
    a distortion sensor electrically communicating with an output of said combiner; wherein said distortion sensor is configured to measure said residual distortion signal; and is configured to generate a distortion sensor signal proportional to said residual distortion signal; and an adaptive bias controller electrically communicating with said distortion sensor;

wherein said adaptive bias controller under control of said distortion sensor signal is configured to change said under-biased DC signal and is configured to change said over-biased DC signal in order to minimize said residual distortion signal.

24. The apparatus of claim 23, wherein said adaptive bias controller further includes:

a programmable digital bias controller configured to preset a programmable minimum residual distortion level.

25. The apparatus of claim 23, wherein said programmable digital bias controller further includes:

a programmable digital bias controller programmed to minimize said programmable minimum residual distortion level to accommodate for a set of external parameters selected from the group consisting of: {an outside temperature level, an output power level, and a frequency range of said apparatus}.

26. The apparatus of claim 21, wherein said digital feedforward loop further includes:

a digital bias controller configured to change said under-biased DC signal and configured to change said over-biased DC signal in order to minimize said residual distortion signal.

27. The apparatus of claim 26, wherein said digital bias controller further includes;

a programmable digital bias controller configured to preset a programmable minimum residual distortion level.

28. The apparatus of claim 27, wherein said programmable digital bias controller further includes:

a programmable digital bias controller programmed to minimize said programmable minimum residual distortion level to accommodate for a set of external parameters selected from the group consisting of: {an outside temperature level, an output power level, and a frequency range of said apparatus}.

29. An apparatus for improving linearity of an RF signal comprising:

a main splitter; said main splitter configured to split an input RF signal into a plurality of local input RF signals; and a plurality of identical complimentary biased pairs of amplifiers; each said complimentary biased pair further comprising:

a splitter configured to receive one said local input RF signal, and configured to split said one local input RF signal into two RF signals comprising a first local input RF signal, and a second local input RF signal;

an over-biased non-linear RF power amplifier configured to receive said first local input RF signal and configured to generate an over-biased non-linear output signal having an over-biased non-linear distortion component; said over-biased non-linear RF power amplifier configured to receive an over-biased DC signal being greater than an optimum bias DC voltage;

an under-biased non-linear RF power amplifier configured to receive said second local input RF signal and configured to generate an under-biased non-linear output signal having an under-biased non-linear distortion component; said under-biased non-linear RF power amplifier configured to receive an under-biased DC signal being lower than said optimum bias DC voltage;

a combiner electrically communicating with said over-biased non-linear RF power amplifier, and electrically communicating with said under-biased non-linear RF power amplifier; said combiner configured to combine said over-biased non-linear output signal and said under-biased non-linear output signal, said combiner configured to output a local RF output signal having a substantially cancelled over-biased non-linear distortion component and having a substantially cancelled under-biased non-linear distortion component; and a circulator electrically communicating with said combiner, wherein said circulator is configured to pass without an additional loss said local RF output power signal having said substantially cancelled over-biased non-linear distortion component and said substantially cancelled under-biased non-linear distortion component to an output of said complimentary biased pair; and wherein said circulator is configured to substantially suppress an RF power signal reflected from said output of said complimentary biased pair, and is configured to substantially prevent said reflected RF signal from entering said complimentary biased pair; and a main combiner configured to combine each said local RF output power signal in order to generate an output RF power signal having substantially cancelled non-linear distortion component.

30. The apparatus of claim 29, wherein said plurality of identical complimentary biased pairs of amplifiers further comprises:

an N integer of identical complimentary biased pairs of amplifiers.

31. An apparatus for improving linearity of an RF signal comprising:

a main splitter; said main splitter configured to split an input RF signal into a plurality of N local input RF signals;

a plurality of N complimentary biased pairs of amplifiers; each said complimentary biased pair further comprising:

an under-biased unit $U_i$; said under-biased unit $U_i$ configured to generate an under-biased non-linear output signal $(LU)_I$ having an under-biased non-linear distortion component $(\delta U)_I$;

an over-biased unit $O_i$; said over-biased unit $O_i$ configured to generate an over-biased non-linear output signal $(LO)_I$ having an over-biased non-linear distortion component $(\delta O)_I$; wherein an absolute value of said under-biased non-linear distortion component $|(\delta U)_i|$ and an absolute value of said over-biased non-linear distortion component $|(\delta O)_i|$ are substantially equal; and a combiner electrically communicating with said under-biased unit $U_i$, and electrically communicating with said over-biased unit $O_i$; said combiner configured to output a local output RF signal $L_i$ having said under-biased non-linear distortion component $(\delta U)_i$ and having said over-biased non-linear distortion component $(\delta O)_i$; wherein said under-biased non-linear distortion component $(\delta U)_i$ and said over-biased non-linear distortion component $(\delta O)_i$ are substantially cancelled; 'i' is an integer less or equal to N; and a main combiner configured to combine each said local output RF signal $L_i$ having substantially cancelled distortion component in order to generate an RF output power signal having substantially cancelled distortion component; 'i' is an integer less or equal to N.

32. The apparatus of claim 31 further comprising;
a circulator electrically communicating with said main combiner, wherein said circulator is configured to pass without an additional loss said RF output power signal having said substantially cancelled distortion component to an output of said apparatus; and wherein said circulator is configured to substantially suppress an RF power signal reflected from said output of said apparatus, and is configured to substantially prevent said reflected RF power signal from entering said apparatus.

33. The apparatus of claim 31, wherein at least one said complimentary biased pair further comprises:
an over-biased non-linear RF power amplifier configured to receive an over-biased DC signal being greater than an optimum bias DC voltage; and
an under-biased non-linear RF power amplifier configured to receive an under-biased DC signal being lower than said optimum bias DC voltage.

34. A method for improving linearity of an RF signal, said method comprising the steps of:
receiving an input RF signal and splitting said input RF signal into two RF signals by utilizing a splitter, said two RF signals comprising a first input RF signal, and a second input RF signal;
generating an over-biased non-linear output signal having an over-biased non-linear distortion component by using an over-biased non-linear RF power amplifier; said over-biased non-linear RF power amplifier configured to receive said first input RF signal; said over-biased non-linear RF power amplifier being biased by an over-biased DC signal being greater than an optimum bias DC voltage;
generating an under-biased non-linear output signal having an under-biased non-linear distortion component by using an under-biased non-linear RF power amplifier; said under-biased non-linear RF power amplifier configured to receive said second input RF signal; said under-biased non-linear RF power amplifier being biased by an under-biased DC signal being lower than said optimum bias DC voltage;
combining said over-biased non-linear output signal and said under-biased non-linear output signal by using a combiner; wherein said combiner is configured to output an RF signal having a residual distortion component;
substantially suppressing an RF power signal reflected from an output of said apparatus and substantially preventing said reflected RF signal from entering said apparatus by using a circulator; and
minimizing said residual distortion component by using an adaptive loop.

35. The method of claim 34, wherein said step of minimizing said residual distortion component by using said adaptive loop further comprises the following steps:
measuring said residual distortion by using a distortion sensor; wherein said distortion sensor is configured to generate a distortion sensor signal proportional to said residual distortion;
changing said under-biased DC signal under control of said distortion sensor signal by using an adaptive bias controller; and
changing said over-biased DC signal under control of said distortion sensor signal by using said adaptive bias controller.

36. The method of claim 34, wherein said step of minimizing said residual distortion component by using said adaptive loop further comprises the following steps:
pre-setting a programmable minimum residual distortion level by using a programmable digital bias controller to accommodate for a set of external parameters selected from the group consisting of: {an outside temperature level, an output power level, and a frequency range of said apparatus}.

37. An apparatus for improving linearity of an RF signal, said apparatus comprising:
a means for receiving an input RF signal and for splitting said input RF signal into two RF signals, said two RF signals comprising a first input RF signal, and a second input RF signal;
a means for generating an over-biased non-linear output signal having an over-biased non-linear distortion component;
a means for generating an under-biased non-linear output signal having an under-biased non-linear distortion component;
a means for combining said over-biased non-linear output signal and said under-biased non-linear output signal;
a means for substantially suppressing an RF power signal reflected from an output of said apparatus and for substantially preventing said reflected RF signal from entering said apparatus; and
a means for minimizing said residual distortion component.

38. The apparatus of claim 37, wherein said means for minimizing said residual distortion component further comprises:
a means for measuring said residual distortion;
a means for generating a distortion signal proportional to said residual distortion; and
a means for using said distortion signal to minimize said residual distortion component.

* * * * *